United States Patent
Hong et al.

(10) Patent No.: US 10,381,275 B2
(45) Date of Patent: Aug. 13, 2019

(54) ARRAY SUBSTRATE AND REPAIRING METHOD THEREOF

(71) Applicant: Wuhan China Star Optoelectronics Technology Co., Ltd., Wuhan, Hubei (CN)

(72) Inventors: Guanghui Hong, Hubei (CN); Qiang Gong, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/749,444

(22) PCT Filed: Jan. 2, 2018

(86) PCT No.: PCT/CN2018/070061
§ 371 (c)(1),
(2) Date: Jan. 31, 2018

(87) PCT Pub. No.: WO2019/104826
PCT Pub. Date: Jun. 6, 2019

(65) Prior Publication Data
US 2019/0164855 A1 May 30, 2019

(30) Foreign Application Priority Data
Nov. 29, 2017 (CN) .......................... 2017 1 1226285

(51) Int. Cl.
*H01L 21/66* (2006.01)
*H01L 27/12* (2006.01)
(Continued)

(52) U.S. Cl.
CPC ........ *H01L 22/22* (2013.01); *H01L 21/76868* (2013.01); *H01L 21/76894* (2013.01);
(Continued)

(58) Field of Classification Search
None
See application file for complete search history.

(56) References Cited

U.S. PATENT DOCUMENTS 6,429,910 B1 * 8/2002 Hirata ............... G02F 1/136204
349/192
8,456,454 B2 * 6/2013 Chen .................... G09G 3/3677
345/204
(Continued)

FOREIGN PATENT DOCUMENTS

| CN | 104143309 A | 11/2014 |
|---|---|---|
| CN | 104505046 A | 4/2015 |

*Primary Examiner* — Andres Munoz
(74) *Attorney, Agent, or Firm* — Hauptman Ham, LLP

(57) ABSTRACT

The present invention provides an array substrate and an repairing method thereof, wherein the array substrate includes adjacent two level GOA unit circuits, wherein an output terminal of a Nth level GOA unit circuit is connected to a Nth level gate line, an output terminal of a N+1th level GOA unit circuit is connected to a N+1th level gate line; and a repairing structure disposed between the Nth level gate line and the N+1th level gate line, the repairing structure configured to turn on the Nth level gate line and the N+1th level gate line by melting when the Nth level GOA unit circuit or the N+1th level GOA unit circuit damaged. A repairing structure is added between two adjacent gate lines, when a certain GOA unit circuit is damaged, the repairing structure is melted by a laser to make the adjacent two gate lines communicate with each other.

8 Claims, 2 Drawing Sheets

(51) Int. Cl.
  *H01L 21/768* (2006.01)
  *H01L 21/48* (2006.01)
  *G02F 1/13* (2006.01)

(52) U.S. Cl.
  CPC ............ *H01L 22/14* (2013.01); *H01L 27/124* (2013.01); *G02F 1/1309* (2013.01); *H01L 21/485* (2013.01)

(56) References Cited

U.S. PATENT DOCUMENTS

| | | | |
|---|---|---|---|
| 9,146,409 B2 * | 9/2015 | Wen | G02F 1/1309 |
| 9,377,661 B2 * | 6/2016 | Zhuang | G02F 1/136259 |
| 9,601,064 B1 * | 3/2017 | Amarilio | G09G 3/36 |
| 2002/0140896 A1 * | 10/2002 | Lee | G02F 1/136259 349/192 |
| 2004/0246395 A1 * | 12/2004 | Chang | G02F 1/136259 349/55 |
| 2005/0157220 A1 * | 7/2005 | Kim | G02F 1/136259 349/38 |
| 2007/0132700 A1 * | 6/2007 | Cho | G09G 3/3677 345/100 |
| 2007/0164972 A1 * | 7/2007 | Chang | G09G 3/3677 345/100 |
| 2008/0043006 A1 * | 2/2008 | Wei | G09G 3/20 345/205 |
| 2009/0152552 A1 * | 6/2009 | Ku | G02F 1/136213 257/59 |
| 2013/0176194 A1 * | 7/2013 | Jin | G09G 3/3233 257/E21.211 |
| 2016/0203782 A1 * | 7/2016 | Xie | G02F 1/1362 345/100 |

\* cited by examiner

ARRAY SUBSTRATE AND REPAIRING METHOD THEREOF

RELATED APPLICATIONS

The present application is a National Phase of International Application Number PCT/CN2018/070061, filed Jan. 2, 2018, and claims the priority of China Application No. 201711226285.0, filed Nov. 29, 2017.

FIELD OF THE DISCLOSURE

The disclosure relates to a panel display technology field, and more particularly to an array substrate and a repairing method thereof.

BACKGROUND

The gate driver on array (GOA) circuit is a circuit for realizing panel progressive scanning. Now the commonly used driving circuit of the panel includes a CMOS GOA circuit and an NMOS GOA circuit. The CMOS GOA circuit includes NTFT devices and PTFT devices, and the NMOS GOA circuit includes only NTFT devices. The commonly used GOA circuit mainly includes a latch circuit, a NAND circuit and a buffer circuit. As shown in FIG. 1, the schematic diagram of a connection way of the existing four-level GOA circuit on the panel is shown. The GOA circuits on the same side realize cascaded connection through the connection of Qn signals, and each level GOA circuit drives a gate line. If the NAND circuit or the buffer circuit of the GOA circuit is damaged due to the manufacturing process or other external factors, the current level GOA circuit cannot work normally, and the gate cannot be turned on. The pixels in a row of the active area (AA) will not work normally, While the other pixels in the active area can work normally. In addition, the pixels in the row where the gate cannot be normally turned on may also be coupled with other signal lines, causing the disorderly display, thereby affecting the display effect of the entire panel.

SUMMARY

The technical problem to be solved by the present invention is to provide an array substrate and a repairing method thereof, so as to avoid GOA circuit damage having an impact on the display effect of the entire panel.

In order to solve the above technical problem, the present invention provides an array substrate, including:

Adjacent two level GOA unit circuits, wherein an output terminal of a Nth level GOA unit circuit is connected to a Nth level gate line, an output terminal of a N+1th level GOA unit circuit is connected to a N+1th level gate line; and A repairing structure disposed between the Nth level gate line and the N+1th level gate line, the repairing structure configured to turn on the Nth level gate line and the N+1th level gate line by melting when the Nth level GOA unit circuit or the N+1th level GOA unit circuit damaged.

Wherein the repairing structure includes:

A first metal block and a second metal block separated from each other;

A third metal block; and

An interlayer medium disposed between the first metal block, the second metal block and the third metal block;

Wherein the first metal block is connected to the Nth level gate line, the second metal block is connected to the N+1th level gate line, the third metal block is connected to the first metal block via a connecting hole formed in the interlayer medium, and forms an overlapping structure with the second metal block, the overlapping structure is configured to be melted when the Nth level GOA unit circuit or the N+1th level GOA unit circuit is damaged and to turn on the Nth level gate line and the N+1th level gate line.

Wherein melting portions are provided at connection portions of the output terminal of the Nth level GOA unit circuit and the N+1th level GOA unit circuit and a current level gate line, and are configured to be melted when the Nth level GOA unit circuit or the N+1th level GOA unit circuit is damaged, and to cut off the connection between the output terminal of the damaged GOA unit circuit and the current level gate line.

Wherein the repairing structure between the Nth level gate line and the N+1th level gate line is disposed close to the N+1th level GOA unit circuit.

Wherein the array substrate further including:

A N−1th level GOA unit circuit, and an output terminal of the N−1th level GOA unit circuit connected to a N−1th level gate line; and A repairing structure disposed between the Nth level gate line and the N−1th level gate line and close to the Nth level GOA unit circuit.

Wherein a melting portion is provided at a connection portion of the N−1th level GOA unit circuit and the current level gate line, and is configured to be melted when the N−1th level GOA unit circuit is damaged, and to cut off the connection between the output terminal of the damaged GOA unit circuit and the current level gate line.

Wherein the first metal block, the second metal block and gates connected to the Nth level gate line and the N+1th level gate line are located in the same layer, and the third metal block is located in the same layer with a data line, a source and a drain.

Wherein the first metal block and the second metal block have the same shape, and have the same height on the substrate, the third metal block includes a first connecting portion connected to the first metal block via the connecting hole, and a second connecting portion forming the overlapping structure with the second metal block, and a third connecting portion connecting the first connecting portion and the second connecting portion.

The present application further provides a repairing method for an array substrate, wherein the array substrate includes adjacent two level GOA unit circuits, an output terminal of the Nth level GOA unit circuit is connected to a Nth level gate line, an output terminal of the N+1th level GOA unit circuit is connected to a N+1th level gate line, wherein the repairing method includes:

Disposing a repairing structure between the Nth level gate line and the N+1th level gate line; and turning on the Nth level gate line and the N₊1th level gate line by melting the repairing structure, and cutting off a connection of an output terminal of the damaged GOA unit circuit and a current level gate line simultaneously, when the Nth level GOA unit circuit or the N+1th level GOA unit circuit is damaged.

Wherein the disposing of the repairing structure specifically includes:

Forming a first metal block and a second metal block separated from each other, and connecting the first metal block with the Nth level gate line, and connecting the second metal block with the N+1th level gate line;

Forming an interlayer medium on the first metal block and the second metal block, and forming a connection hole in the interlayer dielectric; and Forming a third metal block on the interlayer medium, and connecting the third metal block to the first metal block by forming a connection hole, to form an overlapping structure with the second metal block, the overlapping structure is configured to be melted when the Nth level GOA unit circuit or the N+1th level GOA unit circuit damaged and to turn on the Nth level gate line and the N+1th level gate line.

The beneficial effects of the present invention: By adding a repairing structure between two adjacent gate lines, when a certain level of GOA unit circuit is damaged, the repairing structure is melted by the laser, so that the adjacent two gate lines are connected, and driven by the same level GOA unit circuit and not affecting the normal display of the entire panel, thereby realizing the repair function of the GOA circuit, saving the loss of the product sample, and further saving the cost.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description merely show some embodiments of the present invention. For those skilled in the art, other drawings may be obtained based on these drawings without any creative work.

DETAILED DESCRIPTION OF PREFERRED EMBODIMENTS

The following description of various embodiments is made with reference to the accompanying drawings to illustrate specific embodiments in which the invention may be practiced.

Figure 1:
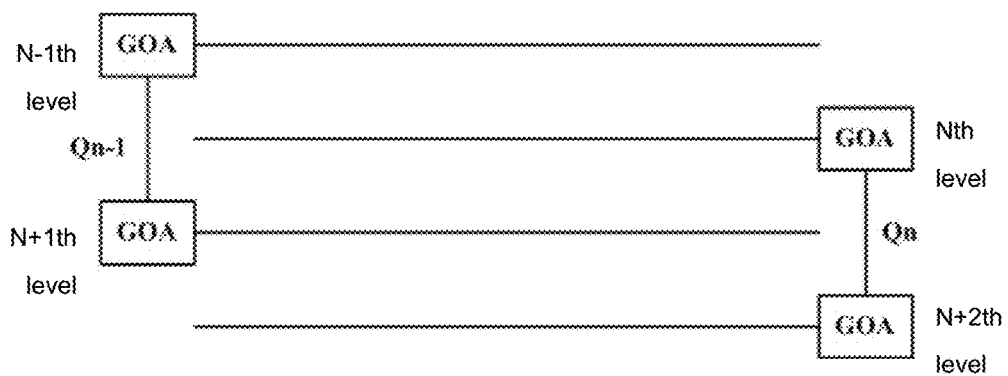
FIG. 1 is a schematic diagram of the connection relationship of the existing four-level GOA circuit on the panel.
Figure 2:
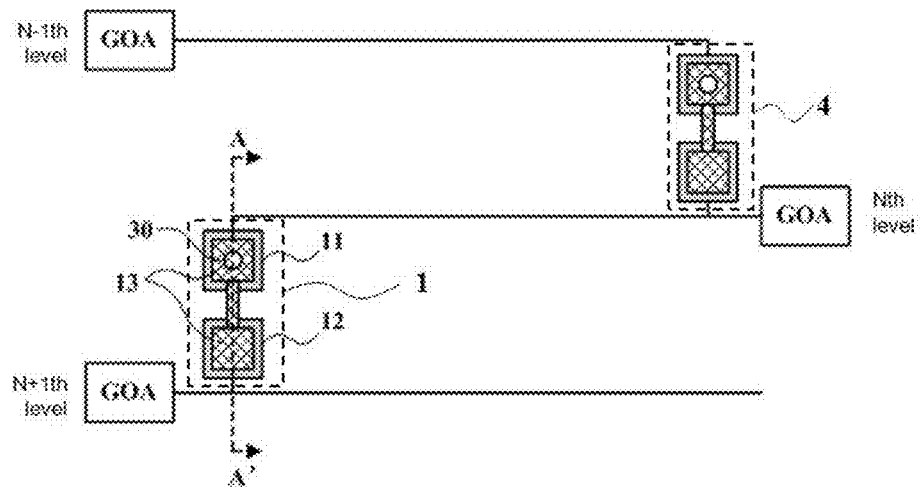
FIG. 2 is a schematic structural diagram of an array substrate according to an embodiment of the present invention.
Figure 3:
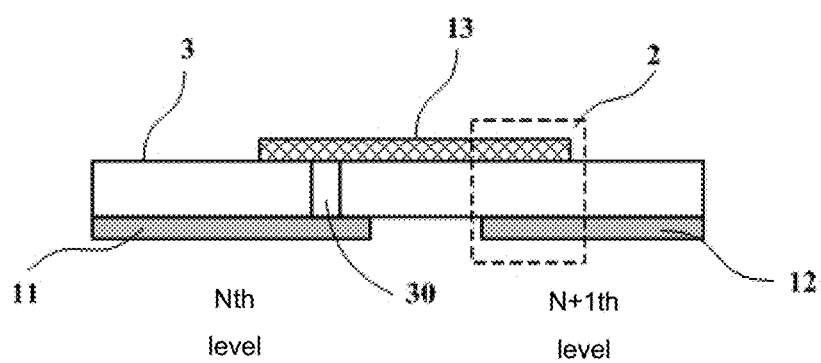
FIG. 3 is a cross-sectional view of the laser repairing structure taken along line AA' in FIG. 2 according to the first embodiment of the present invention.

Referring to FIG. 2 and FIG. 3, an embodiment of the present invention provides an array substrate, includes:

Adjacent two level GOA unit circuits, wherein an output terminal of the Nth level GOA unit circuit is connected to a Nth level gate line, an output terminal of the N+1th level GOA unit circuit is connected to a N+1th level gate line;

A repairing structure 1 disposed between the Nth level gate line and the N+1th level gate line, the repairing structure 1 is for turning on the Nth level gate line and N+1th level gate line by melting when the Nth level GOA unit circuit or the N+1th level GOA unit circuit is damaged.

Specifically, the repairing structure 1 includes a first metal block 11 and a second metal block 12 separated from each other on the substrate, a third metal block 13, and a interlayer medium 3 disposed between the first metal block 11, the second metal block 12 and the third metal block 13, wherein the first metal block 11 is connected to the Nth level gate line, the second metal block 12 is connected to the N+1th level gate line, the third metal block 13 is connected to the first metal block 11 via a connecting hole 30 formed in the interlayer medium 3, and forms an overlapping structure 2 with the second metal block 12, the overlapping structure 2 is configured to be melted when the Nth level GOA unit circuit or the N+1th level GOA unit circuit is damaged so as to turn on the Nth level gate line and the N+1th level gate line.

The repairing structure is added between the gate lines connected by the adjacent GOA unit circuits in the embodiment of the present invention. Since the first metal block 11 and the second metal block 12 are not directly connected, the respective connected gate lines are also not directly connected, therefore it will not affect the normal work of the panel. Once the NAND circuit or the BUFFER circuit of a certain level GOA unit circuit is damaged, the overlapping structure 2 formed by the second metal block 12 and the third metal block 13 can be melted and connected by using a laser or the like method, the damaged GOA unit and the current level gate line are also cut off by means of a laser or the like, so that the adjacent two level gate lines can only be driven by one level of GOA unit circuit. Although the display image may be different, the normal display of the entire panel will not be affected, especially in the display of more saturated image, this effect can be negligible, therefore the repair function of the GOA circuit can be achieved, saving product samples loss, thereby saving costs.

Figure 4:
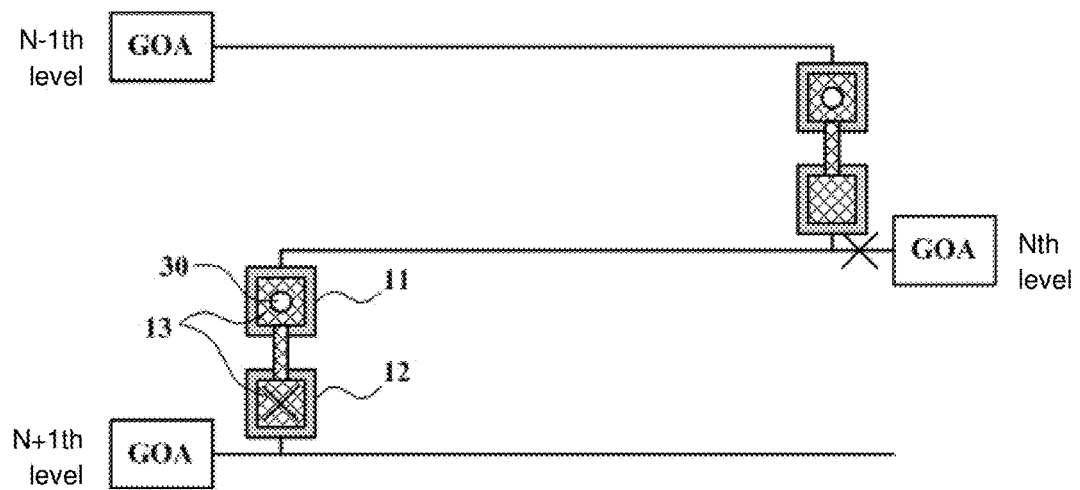
FIG. 4 is a schematic diagram of performing laser repair to the array substrate according to an embodiment of the present invention.

Specifically, taking the connection of adjacent three level GOA unit circuits (N−1th level GOA unit circuit, Nth level GOA unit circuit and N+1th level GOA unit circuit) shown in FIGS. 2-4 as an example, adjacent two level GOA circuits are located on the left and right sides of the active area respectively, that is the N−1th level GOA unit circuit is located on the left side of the active area, the Nth level GOA unit circuit is located on the right side of the active area, and the N+1th level GOA unit circuit is located on the left side of the active area. The N−1th level GOA unit circuit is connected to N−1th level gate line, the Nth level GOA unit circuit is connected to Nth level gate line, the N+1th level GOA unit circuit is connected to N+1th level gate line, the repairing structure 4 are disposed between the N−1th level gate line and Nth level gate line, and the repairing structure 1 are disposed between the Nth level gate line and N+1th level gate line, respectively.

Further, taking the repairing structure 1 provided between the Nth level gate line and the N+1th level gate line as an example, the repairing structure 1 is disposed close to the N+1th level GOA unit circuit (that is the left side of the active area shown in FIG. 2) to avoid occupying the active area, wherein the first metal block 11 is connected to the Nth level gate line, the second metal block 12 is connected to the N+1th level gate line, one end of the third metal block 13 is connected to the first metal block via the connection hole 30 formed in the interlayer medium 3, the other end forms the overlapping structure 2 with the second metal block 12. As described above, the first metal block 11 and the second metal block 12 are separated from each other. Although the third metal block 13 is connected to the first metal block 11 through the connection hole 30, and the third metal block 13 is not directly connected to the second metal block 12 (the interlayer medium 3 is interposed between the third metal block 13 and the second metal block 12 in the side forming the overlapping structure 2), that is, there is no direct connection between the Nth level gate line and the N+1th level gate line, and will not affect the normal work of the panel. In addition, melting portions are provided at the connection portions of the output terminals of the Nth level GOA unit circuit and the N+1th level GOA unit circuit to the current level gate line, and is used for being melted when the Nth level GOA unit circuit or the N+1th level GOA unit circuit is damaged, so as to cut off the connection between the output terminal of a damaged GOA unit circuit and the current level gate line.

If the NAND circuit or the BUFFER circuit of the Nth level GOA unit circuit is damaged, the overlapping structure 2 formed by the second metal block 12 and the third metal block 13 is melted (as indicated by "x" in FIG. 4) by the laser, making the third metal block 13 electrically connected to the second metal block 12, to form a signal pass line of Nth level gate line-the first metal block 11-the connection hole 30-the molten third metal block 13 and the second metal block 12-the N+1th level gate line; the connection between the output terminal of the damaged Nth level GOA unit circuit and the current level gate line (Nth level gate line) is also cut off by the laser at the melting portion (as indicated by "X" in FIG. 4) simultaneously, the damaged Nth level GOA unit circuit can no longer drive the current level gate line, but the adjacent two level gate lines (Nth level gate line and N+1th level gate line) can be driven by the same level GOA unit circuit (N+1th level GOA unit circuit), that is, one level GOA unit circuit drives two level gate lines, although the display image will be different, but it will not affect the normal display of the entire panel, especially in the display of more saturated image, this effect can be negligible, in order to achieve the normally driving of the same level gate line although the GOA unit circuit is damaged, finally achieve the repair function of the GOA circuit, and to ensure the normal use of the panel. It should be noted that, the repairing structure 4 provided between the N–1th level gate line and the Nth level gate line, since the overlapping structure formed by the third metal block and the second metal block is not melted, the N–1th level gate line and the Nth level gate line are not in communication, and there is no interaction between the two.

It can be understood that, the repairing structure 4 between the Nth level gate line and the N–1th level gate line is close to the Nth level GOA unit circuit (that is disposed in the right side of the active area shown in FIG. 2) to avoid occupancy active area. Likewise, the melting portions is provided in the connection portion of the N–1th level GOA unit circuit and the current level gate line, and are used for being melted when the N–1th level GOA unit circuit is damaged, so as to cut off the connection between the output terminal of the damaged GOA unit circuit and the current level gate line.

In this embodiment, the first metal block 11, the second metal block 12 and the gates connected to the Nth level gate line and the N+1th level gate line are located in the same layer, and formed in the same process. The third metal block 13 is located in the same layer with the data line, a source and a drain to eliminate the need to add new processes due to the addition of a repairing structure 1.

Figure 5:
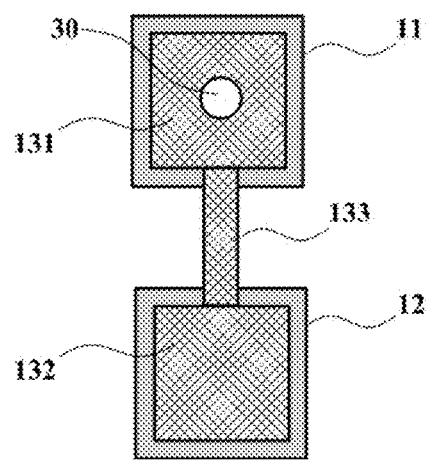
FIG. 5 is a schematic diagram of a repairing structure in the first embodiment of the present invention.

As shown in FIG. 5, in this embodiment, the first metal block 11 and the second metal block 12 have the same shape, and have the same height on the substrate. The third metal block 13 includes a first connecting portion 131 connected to the first metal block 11 via the connecting hole 30, and a second connecting portion 132 forming the overlapping structure 2 with the second metal block 12, and a third connecting portion 133 connecting the first connecting portion 131 and the second connecting portion 132.

The GOA circuit in this embodiment is specifically a CMOS GOA circuit, and can be applied to a cell phone, a display, a television and the like to realize the CMOS GOA circuit repair function.

Corresponding to the first embodiment of the present invention, a second embodiment of the present invention provides a repairing method for an array substrate, wherein the array substrate includes adjacent two level GOA unit circuits, an output terminal of the Nth level GOA unit circuit is connected to a Nth level gate line, an output terminal of the N+1th level GOA unit circuit is connected to a N+1th level gate line, wherein the repairing method includes:

Disposing a repairing structure between the Nth level gate line and the N+1th level gate line;

Turning on the Nth level gate line and the N+1th level gate line by melting the repairing structure and cutting off a connection of an output terminal of the damaged GOA unit circuit and the current level gate line simultaneously, when the Nth level GOA unit circuit or the N+1th level GOA unit circuit is damaged.

Wherein, the disposing of the laser repairing structure specifically includes:

Forming a first metal block and a second metal block separated from each other, and connecting the first metal block with the Nth level gate line, and connecting the second metal block with the N+1th level gate line;

Forming an interlayer medium on the first metal block and the second metal block, and forming a connection hole in the interlayer dielectric;

Forming a third metal block on the interlayer medium and connecting the third metal block to the first metal block by forming the connection hole, to form an overlapping structure with the second metal block, the overlapping structure is configured to be melted when the Nth level GOA unit circuit or the N+1th level GOA unit circuit is damaged, so that turning on the Nth level gate line and the N+1th level gate line.

It can be seen from the above description that the beneficial effects of the embodiments of the present invention are as follows: By adding a repairing structure between two adjacent gate lines, when a certain level of GOA unit circuit is damaged, the repairing structure is melted by the laser, so that the adjacent two gate lines are connected, and driven by the same level GOA unit circuit and not affecting the normal display of the entire panel, thereby realizing the repair function of the GOA circuit, saving the loss of the product sample, and further saving the cost.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. An array substrate, comprising:
adjacent two level gate driver on array unit circuits, wherein an output terminal of a Nth level gate driver on array unit circuit is connected to a Nth level gate line, an output terminal of a N+1th level gate driver on array unit circuit is connected to a N+1th level gate line; and
a repairing structure disposed between the Nth level gate line and the N+1th level gate line, the repairing structure configured to turn on the Nth level gate line and the N+1th level gate line by melting when the Nth level gate driver on array unit circuit or the N+1th level gate driver on array unit circuit is damaged;

wherein the repairing structure comprises:
- a first metal block and a second metal block separated from each other;
- a third metal block; and
- an interlayer medium disposed between the first metal block, the second metal block and the third metal block;
- wherein the first metal block is connected to the Nth level gate line, the second metal block is connected to the N+1th level gate line, the third metal block is connected to the first metal block via a connecting hole formed in the interlayer medium, and forms an overlapping structure with the second metal block, the overlapping structure is configured to be melted when the Nth level gate driver on array unit circuit or the N+1th level gate driver on array unit circuit is damaged and to turn on the Nth level gate line and the N+1th level gate line.

2. The array substrate according to claim 1, wherein melting portions are provided at connection portions of the output terminal of the Nth level gate driver on array unit circuit and the N+1th level gate driver on array unit circuit and a current level gate line, and are configured to be melted when the Nth level gate driver on array unit circuit or the N+1th level gate driver on array unit circuit is damaged, and to cut off the connection between the output terminal of the damaged gate driver on array unit circuit and the current level gate line.

3. The array substrate according to claim 1, wherein the repairing structure between the Nth level gate line and the N+1th level gate line is disposed close to the N+1th level gate driver on array unit circuit.

4. The array substrate according to claim 1, further comprising:
- a N−1th level gate driver on array unit circuit, and an output terminal of the N−1th level gate driver on array unit circuit connected to a N−1th level gate line; and
- a repairing structure disposed between the Nth level gate line and the N−1th level gate line and close to the Nth level gate driver on array unit circuit.

5. The array substrate according to claim 4, wherein a melting portion is provided at a connection portion of the N−1th level gate driver on array unit circuit and the current level gate line, and is configured to be melted when the N−1th level gate driver on array unit circuit is damaged, and to cut off the connection between the output terminal of the damaged gate driver on array unit circuit and the current level gate line.

6. The array substrate according to claim 1, wherein the first metal block, the second metal block and gates connected to the Nth level gate line and the N+1th level gate line are located in the same layer, and the third metal block is located in the same layer with a data line, a source and a drain.

7. The array substrate according to claim 1, wherein the first metal block and the second metal block have the same shape, and have the same height on the array substrate, the third metal block comprises a first connecting portion connected to the first metal block via the connecting hole, and a second connecting portion forming the overlapping structure with the second metal block, and a third connecting portion connecting the first connecting portion and the second connecting portion.

8. A repairing method for an array substrate, wherein the array substrate comprises adjacent two level gate driver on array unit circuits, an output terminal of the Nth level gate driver on array unit circuit is connected to a Nth level gate line, an output terminal of the N+1th level gate driver on array unit circuit is connected to a N+1th level gate line, wherein the repairing method comprises:
- disposing a repairing structure between the Nth level gate line and the N+1th level gate line; and
- turning on the Nth level gate line and the N+1th level gate line by melting the repairing structure, and cutting off a connection of an output terminal of a damaged gate driver on array unit circuit and a current level gate line simultaneously, when the Nth level gate driver on array unit circuit or the N+1th level gate driver on array unit circuit is damaged;

wherein the disposing of the repairing structure specifically comprises:
- forming a first metal block and a second metal block separated from each other, and connecting the first metal block with the Nth level gate line, and connecting the second metal block with the N+1th level gate line;
- forming an interlayer medium on the first metal block and the second metal block, and forming a connection hole in the interlayer dielectric; and
- forming a third metal block on the interlayer medium, and connecting the third metal block to the first metal block by forming a connection hole, to form an overlapping structure with the second metal block, the overlapping structure is configured to be melted when the Nth level gate driver on array unit circuit or the N+1th level gate driver on array unit circuit is damaged and to turn on the Nth level gate line and the N+1th level gate line.

\* \* \* \* \*